(12) United States Patent
Fan

(10) Patent No.: US 6,731,534 B1
(45) Date of Patent: May 4, 2004

(54) BIT LINE TRACKING SCHEME WITH CELL CURRENT VARIATION AND SUBSTRATE NOISE CONSIDERATION FOR SRAM DEVICES

(75) Inventor: Chang Meng Fan, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/338,122

(22) Filed: Jan. 7, 2003

(51) Int. Cl.[7] ............................................. G11C 11/00
(52) U.S. Cl. ...................................... 365/154; 365/156
(58) Field of Search .................................. 365/154, 156

(56) References Cited

U.S. PATENT DOCUMENTS

| | | | |
|---|---|---|---|
| 5,831,315 A | 11/1998 | Kengeri et al. | 257/393 |
| 6,072,732 A | 6/2000 | McClure | 365/191 |
| 6,111,813 A | 8/2000 | Huang | 365/233.5 |
| 6,272,039 B1 * | 8/2001 | Clemens et al. | 365/154 |

* cited by examiner

*Primary Examiner*—Huan Hoang
(74) *Attorney, Agent, or Firm*—George O. Saile; Stephen B. Ackerman; Rosemary L.S. Pike

(57) ABSTRACT

Described are a method and device for tracking memory cell currents using a tracking memory cell circuit wherein the challenges resulting from current degradation and process variations are eliminated. A special strap cell is provided to eliminate ground bounce phase shifting. The tracking and strap cells along with the tracking scheme allow for better tracking of current within the array without the necessity of adding timing margin. The tracking memory cell circuit is a modified version of the memory cell used in the memory array and provides a reference current for the sense amplifier that is compared against the addressed memory cell. Tracking cells are placed in the center of the memory array making them nearer to the active memory cells. As a result, they better mirror the physical and electrical characteristics of the active memory cells over previous methods.

11 Claims, 2 Drawing Sheets

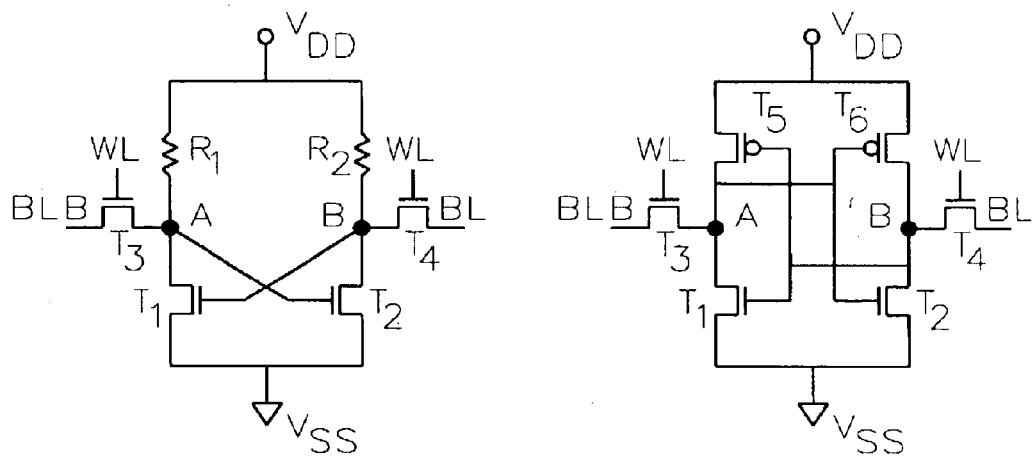
*FIG. 1a*  *FIG. 1b*
*Prior Art*  *Prior Art*
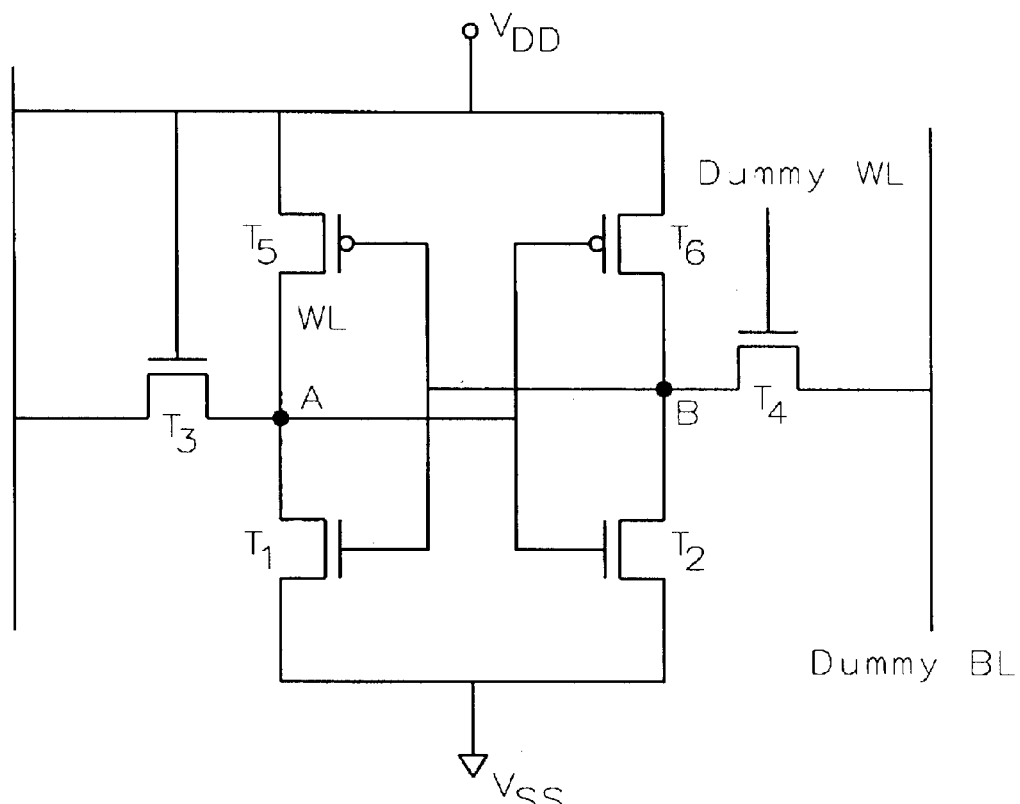
*FIG. 2*

BIT LINE TRACKING SCHEME WITH CELL CURRENT VARIATION AND SUBSTRATE NOISE CONSIDERATION FOR SRAM DEVICES

BACKGROUND OF THE INVENTION (1) Field of the Invention

The invention generally relates to a semiconductor memory and more particularly, to a circuit and method to track the current variations in SRAM memory cell devices fabricated on an integrated circuit (IC).

(2) Description of Prior Art

In a standard static random access memory (SRAM), memory cells are arranged in an array of rows and columns. The memory cells each typically comprise four or six transistors as shown in FIGS. 1a and 1b, respectively. Refer now to the four-transistor memory cell of FIG. 1a. A latch is formed with $T_1$, $T_2$, $R_1$ and $R_2$. If the cell is storing a memory value such that node A is high (pulled up through $R_1$), the gate of NMOS transistor $T_2$ is high, thereby turning on $T_2$. This pulls node B and the gate of NMOS transistor $T_1$ low thereby turning $T_1$ off and holding node A high. Conversely, if the cell is storing the opposite value, node A would be low and node B would be high. The six-transistor cell of FIG. 1b functions in essentially the same way except that PMOS transistors $T_5$ and $T_6$ replace the pull-up resistors $R_1$ and $R_2$.

Each memory cell is connected to one of a plurality of word lines (WL) and to one of a plurality of bit lines (BL) and their inverses (BLB). Memory writing is accomplished by placing a high level (1) on the addressed word line and the desired logic level on the bit lines (BL and BLB) and latching the desired value through pass NMOS transistors $T_3$ and $T_4$. Memory reading is accomplished by placing a high level (1) on the addressed word line and detecting currents in a sense amplifier (not shown) through pass NMOS transistors $T_3$ and $T_4$.

In larger SRAM devices, the memory cell array is divided into sections because use of a large single array results in degradation of the device speed performance due to the long word lines which add additional resistance in word, bit and supply lines. This compounds the switching speed problem resulting from increased capacitive loading driven by the increased memory capacity.

Another problem inherent to large SRAM devices is the wide distribution of the memory cell current characteristics within the device. These variations can result in misinterpretation of the data stored in the memory cell by the sense amplifier. The current variations are a result of process variations, cell placement within the device and the aggressive design rules necessary to reduce the size of the memory cells.

Power strapping is a method where multiple path $V_{DD}$ and $V_{SS}$ (ground) signals are strapped to each memory cell to aid in the reduction of sagging and bumping of $V_{DD}$ and $V_{SS}$ potentials during the simultaneous addressing of multiple memory cells or unbalanced supply lines. In cases where the strap contacts are misaligned, the straps may not be completely effective. U.S. Pat. No. 5,831,315 to Kengeri et al. teaches a method whereby $V_{SS}$ straps are created with some alignment tolerance. However, in large capacity advanced SRAM memory design, $V_{SS}$ power strapping for each cell is limited. The voltage bump on the source side of the pull-down NMOS transistors ($T_1$ and $T_2$) will degrade the cell current during the bump transient. In some bit cell designs, the voltage bump on the low (0) side of the latch may partially turn on the pull-down NMOS ($T_1$ or $T_2$) on the high (1) side of the latch. This voltage dip on the high side may reduce still further the current on the low side.

One other effect which may degrade the cell current is ground bouncing phase-shift (GBPS). The $V_{SS}$ line is grounded and electrically connected to the sources of the pull down NMOS transistors ($T_1$ and $T_2$). The circuit is formed in a p-substrate electrically connected to ground using substrate contacts distributed throughout the integrated circuit. Noise from switching on the ground supply line will appear first on the substrate and then, due to distributed resistance and capacitance, appear on the $V_{SS}$ line. This results in a voltage difference between the sources of the pull down NMOS transistors ($T_1$ and $T_2$) and the p-substrate. This difference in potential will cause the current characteristics of the memory cells to change whenever the substrate potential falls below the $V_{SS}$ line potential.

Because of process variations across the integrated circuit, the wide variation in cell current distribution seen during switching is common in larger capacity SRAM devices. To overcome the problems caused by process variations in sensing the cell current, additional margin is typically added to the access time. U.S. Pat. No. 6,111,813 to Huang teaches a method whereby the sense amplifier in a synchronous RAM is enabled by detection of a global word line and sub-word line signals rather than after a fixed margin after a clock pulse. Using sub-word lines, Huang reduces the overall capacitive load. The use of these sub-word line signals to enable the sense amplifier reduces the amount of necessary margin added to the access time. U.S. Pat. No. 6,072,732 to McClure describes a method whereby a reset is applied after a fixed delay following activation of a word line in a memory device. This minimizes access time and prevents simultaneous writing of sequentially addressed word lines. The present invention minimizes the differences between tracking cell and addressed memory cell thereby eliminating the necessity of margin being added to the access time.

SUMMARY OF THE INVENTION

A principal object of the present invention is to provide a method that reduces access time in an SRAM device.

A second object of the present invention is to provide a method of tracking bit line current in a memory cell.

Another object of the present invention is to provide a circuit for tracking bit line current in a memory cell.

A further object of the present invention is to provide a circuit for bit line tracking capable of tracking a wider distribution of memory cell current.

A still further object of the present invention is to provide a circuit for bit line tracking capable of tracking cell current under conditions due to ground bumping on the power lines.

A still further object of the present invention is to provide a circuit for bit line tracking capable of tracking cell current under conditions due to voltage sagging on the high side of the memory cell latch.

A still further object of the present invention is to provide circuit for bit line tracking capable of tracking cell current under conditions due variations in strap cell alignment.

A still further object of the present invention is to provide a method that eliminates the body effect caused by ground bounce phase shifting.

A still further object of the present invention is to provide a strap circuit that eliminates the body effect caused by ground bounce phase shifting.

These objects are achieved using a method for tracking memory cell currents using a tracking memory cell circuit whereby the challenges resulting from current degradation and process variations are eliminated. A special strap cell is provided to eliminate ground bounce phase shifting. The tracking and strap cells along with the tracking scheme allow for better tracking of current within the array without the necessity of adding timing margin. The tracking memory cell circuit is a modified version of the memory cell used in the memory array. The tracking memory cell current provides a reference current for the sense amplifier that is compared against the addressed memory cell. Tracking cells are placed in the center of the memory array making them nearer to the active memory cells. They better mirror the physical and electrical characteristics of the active memory cells over previous methods. The strap cell makes contact between the $V_{SS}$ metal line and a lightly doped n-type region within the p-substrate. This forms a low $V_{th}$ diode with a turn-on voltage between about 0 and 0.2 volts between the substrate and $V_{SS}$. This strapping of $V_{SS}$ to the substrate reduces the effect of ground bounce phase shifting.

BRIEF DESCRIPTION OF THE DRAWINGS

In the accompanying drawings forming a material part of this description, there is shown:

FIGS. 1a and 1b showing a typical four-transistor and six-transistor SRAM memory cell, respectively;

FIG. 2 showing the schematic of the tracking cell of the present invention;

DESCRIPTION OF THE PREFERRED EMBODIMENTS

The preferred embodiment of the present invention describes a method and circuit that facilitate tracking of the current variations between memory cells in different locations within the memory cell array. The present invention comprises a tracking cell (FIG. 2) and a strap cell (FIG. 3).

Refer now to FIG. 2 showing the tracking cell. The tracking cell is nearly identical to the six-transistor memory cell of FIG. 1b, so the same transistor designations will be used. The difference between the tracking cell and the six-transistor memory cell is that the gate and drain of $T_3$ are tied to $V_{DD}$. This connection is preferably done in the metal layer, thus keeping the characteristics of the tracking cell and six-transistor memory cell as close to identical as possible. Under this condition, the tracking cell is held such that node A is held high (through $T_3$) and node B is held low. While the active devices of the tracking cell are normally designed to be identical to the standard memory cell, the tracking cells may be modified to accommodate process variations.

Figure 3:
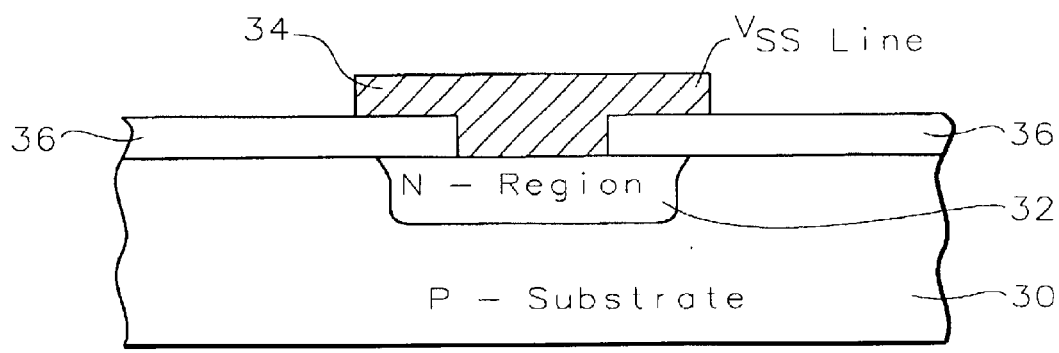
FIG. 3 showing in cross section the layout of the strap cell of the present invention.

Refer now to FIG. 3 depicting a special strap cell used to reduce the effects of ground bouncing phase shift. In the special strap, a lightly doped n-region 32 is patterned into p-substrate 30 forming a low $V_{th}$ diode. A metal $V_{SS}$ line 34 makes contact with the lightly doped n-region through an insulating layer 36. This $V_{SS}$ line 34 is grounded and electrically connected to the sources of the pull down NMOS transistors of the tracking cell ($T_1$ and $T_2$ of FIG. 2) and memory cells. As described earlier, the p-substrate 30 is electrically connected to ground using substrate contacts (not shown) distributed throughout the integrated circuit. When ground bouncing phase shift causes the $V_{SS}$ line 34 potential to exceed the substrate 30 potential, the low $V_{th}$ diode clamps that voltage difference to between about 0 and 0.2 volts. This minimizes the effect on the cell current characteristics.

Figure 4:
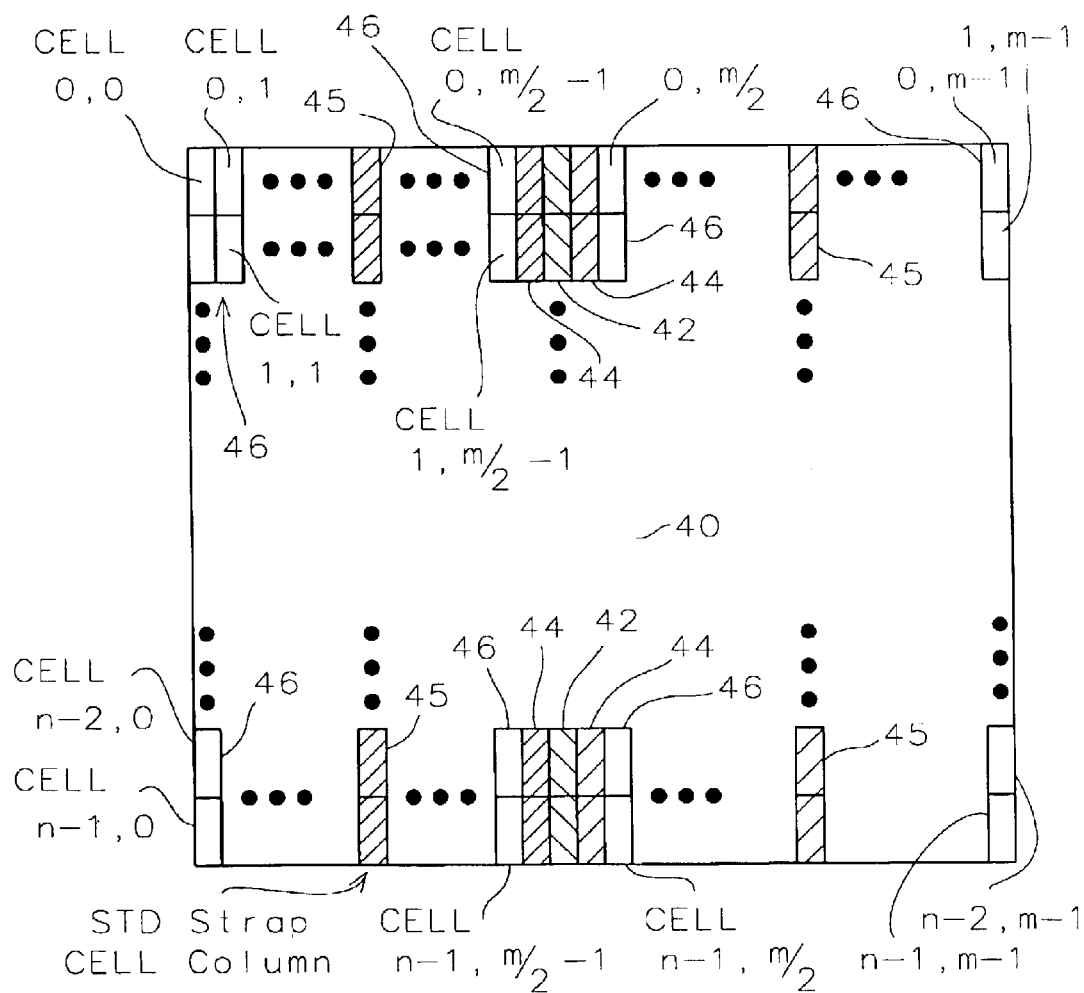
FIG. 4 showing the preferred layout of the memory cell array utilizing the tracking cell and strap cell of the present invention.

FIG. 4 shows the preferred layout of the array using the tracking cell 42 and strap cell 44. The tracking cells 42 are arranged in a column at the center of an N word line×M bit line memory array 40. There is one tracking cell for each word line. A special strap cell 44 is placed on each side of the tracking cell 42. In addition, regular strap cells 45 are placed in columns at locations next to bit cells. The remainder of the memory array is filled with SRAM bit cells 46.

The present invention uses a method for tracking memory cell currents using a tracking memory cell circuit and strap cell which eliminates the need to add margin timing over prior art methods. The problems resulting from current degradation and process variations within the memory cell are minimized. The strap cell is provided to eliminate ground bounce phase shifting. The tracking and strap cells along with the tracking scheme allow for better tracking of current within the array without the necessity of adding timing margin. The tracking memory cell circuit is a modified version of the memory cell used in the memory array. The tracking memory cell current provides a reference current for the sense amplifier that is compared against the addressed memory cell. Tracking cells are placed in the center of the memory array to better mirror the physical and electrical characteristics of the active cells. The strap cell makes contact between the $V_{SS}$ metal line and a lightly doped n-type region within the p-substrate thereby forming a low $V_{th}$ diode between the substrate and $V_{SS}$ and helps to maintain the ground potential seen by the memory array.

While the invention has been particularly shown and described with reference to the preferred embodiments thereof, it will be understood by those skilled in the art that various changes in form and details may be made without departing from the spirit and scope of the invention.

What is claimed is:

1. A device for tracking the current characteristics of memory cells in a SRAM semiconductor memory comprising:
   a tracking cell column placed at the center of a memory cell array wherein said tracking cell column is composed of tracking cells using the same active components as each of said memory cells, but having different electrical interconnections;
   a first and second strap cell column located on each side of said tracking cell column, and
   a plurality of additional of said strap cells columns throughout said memory array, thereby completing said current tracking device.

2. The device of claim 1 wherein each of said tracking cells comprises:
   a first and second pull-down NMOS transistor with the source electrode of each of said first and second pull-down NMOS transistor electrically connected to $V_{SS}$;
   a first and second pull-up PMOS transistor with the drain electrode of each of said first and second pull-up PMOS transistor electrically connected to $V_{DD}$;
   a first pass transistor wherein:
      the source electrode of said first pass transistor is electrically connected to the drain electrode of said first pull-down NMOS transistor, the source electrode of said first pull-up PMOS transistor and the gate electrodes of said second pull-down NMOS and said second pull-up PMOS transistors; and the drain electrode and gate electrode of said first pass transistor are electrically connected to $V_{DD}$; and a second pass transistor wherein:

the source electrode of said second pass transistor is electrically connected to the drain electrode of said second pull-down NMOS transistor, the source electrode of said second pull-up PMOS transistor and the gate electrodes of said first pull-down NMOS and said first pull-up PMOS transistors;

the drain electrode of said second pass transistor is electrically connected to a dummy bit line; and the gate electrode of said second pass transistor is electrically connected to a dummy word line thereby completing said tracking cell.

3. The device of claim 2, wherein said different electrical interconnections for said tracking cell over said memory cell comprise said connections of the drain electrode and the gate electrode of said first pass transistor to $V_{DD}$.

4. The device of claim 1, wherein said strap cell column comprises a plurality of strap cells wherein each of said strap cells comprises:

a p-substrate electrically connected to $V_{SS}$;

a lightly doped n-region formed within said p-substrate;

an insulating layer overlying said n-region and said p-substrate; and a conductive layer connected to $V_{SS}$ filling an opening in said insulating layer to a surface of said n-region and thereby facilitating contact to said n-region thereby completing said strap cell.

5. A device for tracking the current characteristics of memory cells in a SRAM semiconductor memory comprising:

a tracking cell column placed at the center of a memory cell array wherein said tracking cell column is composed of tracking cells using the same active components as each of said memory cells, but having different electrical interconnections and wherein each of said tracking cells comprises:

a first and second pull-down NMOS transistor with the source electrode of each of said first and second pull-down NMOS transistor electrically connected to $V_{SS}$;

a first and second pull-up PMOS transistor with the drain electrode of each of said first and second pull-up PMOS transistor electrically connected to $V_{DD}$;

a first pass transistor wherein:

the source electrode of said first pass transistor is electrically connected to the drain electrode of said first pull-down NMOS transistor, the source electrode of said first pull-up PMOS transistor and the gate electrodes of said second pull-down NMOS and said second pull-up PMOS transistors; and the drain electrode and gate electrode of said first pass transistor are electrically connected to $V_{DD}$; and a second pass transistor wherein:

the source electrode of said second pass transistor is electrically connected to the drain electrode of said second pull-down NMOS transistor, the source electrode of said second pull-up PMOS transistor and the gate electrodes of said first pull-down NMOS and said first pull-up PMOS transistors;

the drain electrode of said second pass transistor is electrically connected to a dummy bit line; and the gate electrode of said second pass transistor is electrically connected to a dummy word line;

a first and second strap cell column located on each side of said tracking cell column, and a plurality of additional of said strap cells columns throughout said memory array, thereby completing said current tracking device.

6. The device of claim 5, wherein said different electrical interconnections for said tracking cell over said memory cell comprise said connections of the drain electrode and the gate electrode of said first pass transistor to $V_{DD}$.

7. The device of claim 5, wherein said strap cell column comprises a plurality of strap cells wherein each of said strap cells comprises:

a p-substrate electrically connected to $V_{SS}$;

a lightly doped n-region formed within said p-substrate;

an insulating layer overlying said n-region and said p-substrate; and a conductive layer connected to $V_{SS}$ filling an opening in said insulating layer to a surface of said n-region and thereby facilitating contact to said n-region thereby completing said strap cell.

8. A method of tracking the current characteristics of memory cells in a SRAM semiconductor memory comprising a device employing:

a tracking cell column placed at the center of a memory cell array wherein said tracking cell column is composed of tracking cells using the same active components as each of said memory cells, but having different electrical interconnections;

a first and second strap cell column located on each side of said tracking cell column, and a plurality of additional of said strap cells columns throughout said memory array;

wherein the current characteristics of each of said tracking cells are substantially similar to said current characteristics of said memory cells in proximity to said tracking cell, and wherein to determine the logic state stored within an addressed one of said memory cells, the current characteristics of said addressed one of said memory cells is compared to one of said tracking cells.

9. The method of claim 8 wherein each of said tracking cells comprises:

a first and second pull-down NMOS transistor with the source electrode of each of said first and second pull-down NMOS transistor electrically connected to $V_{SS}$;

a first and second pull-up PMOS transistor with the drain electrode of each of said first and second pull-up PMOS transistor electrically connected to $V_{DD}$;

a first pass transistor connected wherein:

the source electrode of said first pass transistor is electrically connected to the drain electrode of said first pull-down NMOS transistor, the source electrode of said first pull-up PMOS transistor and the gate electrodes of said second pull-down NMOS and said second pull-up PMOS transistors; and the drain electrode and gate electrode of said first pass transistor are electrically connected to $V_{DD}$; and a second pass transistor connected wherein:

the source electrode of said second pass transistor is electrically connected to the drain electrode of said second pull-down NMOS transistor, the source electrode of said second pull-up PMOS transistor and the gate electrodes of said first pull-down NMOS and said first pull-up PMOS transistors;

the drain electrode of said second pass transistor is electrically connected to a dummy bit line; and the gate electrode of said second pass transistor is electrically connected to a dummy word line thereby completing said tracking cell.

10. The method of claim 9, wherein said different electrical interconnections for said tracking cell over said memory cell comprise said connections of the drain electrode and the gate electrode of said first pass transistor to $V_{DD}$.

11. The method of claim 8, wherein said strap cell column comprises a plurality of strap cells wherein each of said strap cells comprises:

a p-substrate electrically connected to $V_{SS}$;

a lightly doped n-region formed within said p-substrate;

an insulating layer overlying said n-region and said p-substrate; and a conductive layer connected to $V_{SS}$ filling an opening in said insulating layer to a surface of said n-region and thereby facilitating contact to said n-region thereby completing said strap cell.

* * * * *